(12) United States Patent
Yang et al.

(10) Patent No.: US 11,472,896 B2
(45) Date of Patent: Oct. 18, 2022

(54) IRRADIATION CURABLE POLYOLEFIN FORMULATION

(71) Applicant: Dow Global Technologies LLC, Midland, MI (US)

(72) Inventors: Yongyong Yang, Shanghai (CN); Yabin Sun, Shanghai (CN); Kainan Zhang, Shanghai (CN); Jeffrey M. Cogen, Flemington, NJ (US); Timothy J. Person, Pottstown, PA (US); Paul J. Caronia, Annadale, NJ (US)

(73) Assignee: Dow Global Technologies LLC, Midland, MI (US)

( * ) Notice: Subject to any disclaimer, the term of this patent is extended or adjusted under 35 U.S.C. 154(b) by 353 days.

(21) Appl. No.: 16/620,021

(22) PCT Filed: May 30, 2018

(86) PCT No.: PCT/CN2018/088965
§ 371 (c)(1),
(2) Date: Dec. 6, 2019

(87) PCT Pub. No.: WO2019/001206
PCT Pub. Date: Jan. 3, 2019

(65) Prior Publication Data
US 2020/0199309 A1    Jun. 25, 2020

(30) Foreign Application Priority Data

Jun. 29, 2017   (WO) ................ PCT/CN2017/090770

(51) Int. Cl.
| | | |
|---|---|---|
| C08F 110/02 | (2006.01) | |
| C09D 7/63 | (2018.01) | |
| C08K 5/14 | (2006.01) | |
| C09D 5/00 | (2006.01) | |
| H01B 3/44 | (2006.01) | |
| C08F 10/02 | (2006.01) | |
| C08J 3/28 | (2006.01) | |
| H01B 13/00 | (2006.01) | |
| C08L 23/26 | (2006.01) | |
| C09D 123/26 | (2006.01) | |
| H01B 7/282 | (2006.01) | |
| H01B 7/295 | (2006.01) | |
| C08L 23/06 | (2006.01) | |
| C08L 23/04 | (2006.01) | |

(52) U.S. Cl.
CPC ............ *C08F 110/02* (2013.01); *C08F 10/02* (2013.01); *C08J 3/28* (2013.01); *C08K 5/14* (2013.01); *C08L 23/26* (2013.01); *C09D 5/00* (2013.01); *C09D 7/63* (2018.01); *C09D 123/26* (2013.01); *H01B 3/441* (2013.01); *H01B 13/0016* (2013.01); *C08F 2810/20* (2013.01); *C08J 2323/06* (2013.01); *C08L 23/04* (2013.01); *C08L 23/06* (2013.01); *C08L 2023/44* (2013.01); *C08L 2205/025* (2013.01); *C08L 2207/066* (2013.01); *C08L 2312/08* (2013.01); *H01B 7/282* (2013.01); *H01B 7/295* (2013.01)

(58) Field of Classification Search
USPC ...................... 174/110 RM, 120 AR; 522/99
See application file for complete search history.

(56) References Cited

U.S. PATENT DOCUMENTS

| | | |
|---|---|---|
| 3,859,247 A | 1/1975 | MacKenzie, Jr. |
| 3,946,099 A | 3/1976 | MacKenzie, Jr. |
| 4,005,254 A | 1/1977 | MacKenzie, Jr. |
| 4,018,852 A | 4/1977 | Schober |
| 4,376,180 A | 3/1983 | Turbett et al. |
| 5,246,783 A | 9/1993 | Spenadel et al. |
| 5,346,961 A | 9/1994 | Shaw et al. |
| 5,358,786 A * | 10/1994 | Ishikawa .................. H01B 7/29 174/120 SR |
| 5,367,030 A | 11/1994 | Gau et al. |
| 6,187,847 B1 | 2/2001 | Cogen et al. |
| 6,191,230 B1 | 2/2001 | Keogh et al. |
| 6,277,925 B1 | 8/2001 | Biswas et al. |
| 6,404,971 B2 | 6/2002 | Mehl |
| 6,496,629 B2 | 12/2002 | Ma et al. |
| 6,714,707 B2 | 3/2004 | Rossi et al. |
| 6,936,655 B2 | 3/2005 | Borke et al. |

(Continued)

FOREIGN PATENT DOCUMENTS

| | | |
|---|---|---|
| CA | 2732755 | 2/2010 |
| CN | 1803907 | 7/2006 |

(Continued)

OTHER PUBLICATIONS

Liu Gang, et al., Study on cyclosiloxane containing vinylphenyl as crosslinking agent in polypropylene, New Chemical Materials, Oct. 31, 2006, No. 10, vol. 34, pp. 78-80.

F.O. Stark et al., Silicones, Comprehensive Organometallic Chemistry, vol. 2, 305, Pergamon Press (1982).

Introduction to Polymer Chemistry, Stille, Wiley and Sons, New York, 1962, pp. 149 to 151.

J. Wu., et al., Crosslinking of low density polyethylene with Octavinyl polyhedral oligomeric silsesquioxane as the crosslinker, RSC Advances, 2014, vol. 4, p. 44030.

(Continued)

*Primary Examiner* — Fred M Teskin

(57) ABSTRACT

An (electron beam)-curable (EBC) formulation comprising an EBC polyolefin compound having a crystallinity of from 0 to less than 50 weight percent (wt %) and/or having a density of 0.930 gram per cubic centimeter (g/cm$^3$) or less; and an alkenyl-functional monocyclic organosiloxane ("silicon-based coagent"). Also included are a cured polyolefin product prepared by electron-beam irradiating the EBC formulation; methods of making and using the EBC formulation or cured polyolefin product; and articles containing or made from the EBC formulation or cured polyolefin product.

11 Claims, No Drawings

(56) References Cited

U.S. PATENT DOCUMENTS

| | | | |
|---|---|---|---|
| 8,426,519 | B2 | 4/2013 | Cogen et al. |
| 8,449,801 | B2 | 5/2013 | Hsiao et al. |
| 8,691,984 | B2 | 4/2014 | Yamaura |
| 9,147,784 | B2 | 9/2015 | Shirahige et al. |
| 9,670,351 | B2 | 6/2017 | Siddhamalli et al. |
| 2002/0198335 | A1 | 12/2002 | Bernier et al. |
| 2003/0166817 | A1 | 9/2003 | Degussa |
| 2006/0142437 | A1* | 6/2006 | Hakuta ............ C08L 91/00 524/502 |
| 2008/0176981 | A1 | 7/2008 | Biscoglio et al. |
| 2014/0056516 | A1 | 2/2014 | Wee et al. |
| 2015/0376386 | A1 | 12/2015 | Kim et al. |

FOREIGN PATENT DOCUMENTS

| | | |
|---|---|---|
| CN | 101104706 | 1/2008 |
| CN | 102838827 | 12/2012 |
| CN | 103360712 | 10/2013 |
| CN | 103865420 | 6/2014 |
| CN | 104277182 | 1/2015 |
| CN | 104610634 | 5/2015 |
| CN | 104877171 | 9/2015 |
| CN | 106674999 | 5/2017 |
| DE | 2001205 | 7/1970 |
| DE | 102006017346 | 10/2007 |
| EP | 1433811 | 6/2004 |
| EP | 2889323 | 7/2015 |
| ES | 373818 | 2/1972 |
| FR | 2033903 | 12/1970 |
| GB | 1277378 | 6/1972 |
| JP | 48024492 | 7/1973 |
| JP | 11060748 | 3/1999 |
| NL | 7001224 | 8/1970 |
| SE | 368579 | 7/1974 |
| WO | 1996039459 | 12/1996 |
| WO | 00/69930 A1 | 11/2000 |
| WO | 2014030948 | 2/2014 |
| WO | 2015149221 | 10/2015 |
| WO | 2016187755 | 12/2016 |

OTHER PUBLICATIONS

Li, P., A brief product introduction of the organic modified siloxane and applications, Evonik Industries, Nov. 2014.

Wiley Periodicals, Inc. Engineering properties of electron beam-crosslinked ethylene methyl acrylate copolymer. J Appl Polym Sci, 2010.

Pentavinylpentamethylcyclopentasiloxane, 95%, Gelest, Inc., p. 1-6, vol. 77, No. 58, Dec. 4, 2014.

Reactive Silicones: Forging New Polymer Links, Gelest, Inc., p. 13.

* cited by examiner

IRRADIATION CURABLE POLYOLEFIN FORMULATION

CROSS-REFERENCE TO RELATED APPLICATION(S)

This application claims benefit of priority from, and hereby incorporates by reference the entire contents of, PCT International Patent Application Number PCT/CN2017/090770 filed Jun. 29, 2017.

FIELD

Polyolefin compositions, electron beam curing, methods and articles.

INTRODUCTION

Patent application publications in the field include CN103865420A, CN104277182A, DE102006017346A1, EP1433811A2, EP2889323A1, US20020198335A1, and US20080176981A1. Patents in the field include U.S. Pat. Nos. 4,005,254, 5,367,030, 6,187,847B1, 6,191,230B1, 6,936,655B2, 8,426,519B2, 8,449,801B1, 8,691,984B2, and 9,147,784B2.

Electron-beam irradiation is useful in a method of curing (crosslinking) polyolefins. The method comprises applying a dose of electron-beam irradiation to an (electron beam)-curable (EBC) polyolefin compound to give a cured polyolefin product. The method forms covalent bonds directly between polyolefin macromolecules of the EBC polyolefin compound. The electron-beam curing method may be used to cure various types of polyolefins including low density polyethylene (LDPE), linear low density polyethylene (LLDPE), and high density polyethylene (HDPE).

We introduce problems of: (a) how to improve hot creep (hot set) performance of electron-beam cured polyethylenes, (b) how to increase electron-beam irradiation curing of (electron beam)-curable (EBC) polyolefin compounds, and (c) how to make a power cable containing an electron beam-cured insulation layer.

Crosslinked low density polyethylene (XLDPE) and crosslinked linear low density polyethylene (XLLDPE) are used in various industrial applications wherein they are exposed to high operating temperatures, such as hot water pipes and insulation layers of electrical power cables. For these applications the crosslinked polyethylenes should have adequate hot creep (hot set) performance (i.e., retain its shape at operating temperature). Hot creep performance of (electron beam)-crosslinked high density polyethylene is usually weaker than that of (electron beam)-crosslinked linear low density polyethylene. Thus, merely blending a high density polyethylene into a linear low density polyethylene followed by electron-beam curing of the blend would not be expected to improve hot creep performance relative to that of the linear low density polyethylene alone.

If the dose of electron-beam irradiation is too high, undesirable side-effects occur. These include generating excessive amounts of heat, electrical charges, and/or $H_2$ gas. Excessive heat can lead to oxidation or deterioration of the cured polyolefin product. Excessive $H_2$ gas can lead to bubble formation in the cured polyolefin product. Excessive electrical charges can lead to electrical discharges from the cured polyolefin product. If the applied dose is too low, the compound does not adequately cure or reach a sufficient cure state (extent of curing or crosslink density), and the performance of the incompletely cured polyolefin product may be unsuitable for an intended purpose such protecting a cable.

SUMMARY

We disclose a technical solution to one or more of the introduced problems of: (a) how to improve hot creep (hot set) performance of electron-beam cured polyethylenes, (b) how to increase electron-beam irradiation curing of (electron beam)-curable (EBC) polyolefin compounds, and (c) how to make a power cable containing an electron beam-cured insulation layer. The technical solution includes an (electron beam)-curable (EBC) formulation comprising an EBC polyolefin compound ("host resin") having a crystallinity of from 0 to less than 50 weight percent (wt %) and/or having a density of 0.930 gram per cubic centimeter ($g/cm^3$) or less; and an alkenyl-functional monocyclic organosiloxane ("silicon-based coagent"). Embodiments also include a cured polyolefin product (electron beam-cured) prepared by electron-beam irradiating the EBC formulation; methods of making and using the EBC formulation or cured polyolefin product; and articles containing or made from the EBC formulation or cured polyolefin product. The inventive formulation and product are useful in any application in which polyolefins, including crosslinked polyolefins, are utilized, including coatings, films, sheets and injection molded articles.

Severity of the problems caused by too high irradiation doses may be attenuated by mixing a minor amount of silicon-based coagent into the EBC polyolefin compound to give the EBC formulation. The EBC formulation may be cured in absence of a heat-induced free-radical generator compound such as an organic peroxide. The EBC formulation can be cured at a lower dose of the electron-beam irradiation than the dose used to cure the EBC polyolefin compound without the silicon-based coagent. Also, by virtue of the additional crosslinking effect of multivalent crosslinking groups derived from the silicon-based coagent, the resulting cured polyolefin product can reach an equal or greater cure state than that of a comparative cured polyolefin product prepared without the silicon-based coagent at the same lower EB dose. All other things being equal, the higher the loading of the silicon-based coagent in the EBC formulation, the lower the dose of electron-beam irradiation that may be used to achieve a given cure state (extent of crosslinking or crosslink density).

DETAILED DESCRIPTION

The Summary and Abstract are incorporated here by reference. Examples of embodiments include the following numbered aspects.

Aspect 1. An (electron beam)-curable (EBC) formulation comprising constituents (A) and (B): (A) an (electron beam)-curable (EBC) polyolefin compound ("host resin") having a crystallinity of from 0 to less than 50 weight percent (wt %), alternatively from 10 to less than 50 wt %, as measured by Crystallinity Test Method using differential scanning calorimetry (DSC) and/or having a density of 0.930 gram per cubic centimeter ($g/cm^3$) or less, alternatively 0.925 $g/cm^3$ or less, as measured by ASTM D792-13, Method B; and (B) an alkenyl-functional monocyclic organosiloxane of formula (I): $[R^1,R^2SiO_{2/2}]_n$ (I), wherein subscript n is an integer greater than or equal to 3; each $R^1$ is independently a ($C_2$-$C_4$)alkenyl or a $H_2C{=}C(R^{1a}){-}C({=}O){-}O{-}(CH_2)_m{-}$ wherein $R^{1a}$ is H or methyl and subscript m is an integer from 1 to 4; and each $R^2$ is independently H, $(C_1\text{-}C_4)$alkyl, phenyl, or $R^1$ ("silicon-based coagent"); wherein (A) is 50.0 to 99.99 weight percent (wt %), alternatively 80.0 to 99.99 wt %, alternatively 90 to 99.9 wt %, alternatively 95.0 to 99.4 wt %, and (B) is from 50.0 to 0.01 wt %, alternatively 20.0 to 0.01 wt %, alternatively 10 to 0.1 wt %, alternatively 5.0 to 0.6 wt %, of the combined weight of constituents (A) and (B); and with the proviso that the EBC formulation is free of each of a phosphazene base, a semi-crystalline polyolefin having a crystallinity of 50 wt % or greater, and an organic peroxide. The amount of (B) in the EBC formulation is effective for enabling the (A) EBC polyolefin compound of the EBC formulation to be electron beam cured at lower irradiation doses than in the absence of (B). Other than the foregoing excluded materials (phosphazene base, semi-crystalline polyolefin having a crystallinity of 50 wt % or greater, and organic peroxide), the constituents of the EBC formulation are not particularly limited. Certain embodiments are described later as optionally excluding one or more additional materials.

Aspect 2. The EBC formulation of aspect 1 wherein the (A) EBC polyolefin compound is characterized by any one of limitations (i) to (xv): (i) a crystallinity of from >0 to less than 50.0 weight percent (wt %), alternatively from 10 to 45 wt %, alternatively from 15 to 40 wt %, alternatively from 20 to 35 wt %, as measured by Crystallinity Test Method using differential scanning calorimetry (DSC); (ii) a density of 0.930 g/cm$^3$ or less, alternatively from 0.860 to 0.929 g/cm$^3$, alternatively from 0.880 to 0.929 g/cm$^3$, alternatively from 0.900 to 0.929 g/cm$^3$, alternatively from 0.910 to 0.929 g/cm$^3$, as measured by ASTM D792-13, Method B; (iii) both (i) and (ii); (iv) a melt index ($I_2$, 190° C./2.16 kg load) of 0.1 to 20 grams per 10 minutes (g/10 min.), alternatively 0.2 to 20 g/10 min., alternatively 0.5 to 10 g/10 min., all measured according to the Melt Index Test Method (described later) and is a polyethylene; (v) a melt flow rate (MFR) of 0.5 to 20 g/10 min. (230° C./2.16 kg load) measured according to the Melt Flow Rate Test Method (described later) and is a polypropylene; (vi) a molecular weight distribution (MWD) that is monomodal; (vii) a MWD that is multimodal, alternatively bimodal; (viii) wherein the combined weight of constituents (A) and (B) is from 50 to 100 wt % alternatively from 70 to 100 wt %, alternatively from 80 to 100 wt %, alternatively from 90 to 100 wt %, alternatively from 50 to 99.9 wt % alternatively from 70 to 99.9 wt %, alternatively from 80 to 99.9 wt %, alternatively from 90 to 99.9 wt % of the EBC formulation; (ix) the (A) EBC polyolefin compound is a low density polyethylene (LDPE) having a density from 0.910 to 0.925 g/cm$^3$; (x) the (A) EBC polyolefin compound is a linear low density polyethylene (LLDPE) having a density from 0.910 to 0.925 g/cm$^3$; (xi) the (A) EBC polyolefin compound is a polyethylene elastomer selected from elastomers based on ethylene copolymers such as an ethylene-propylene rubber (EPR), an ethylene-1-butene rubber (EBR), and an ethylene-1-octene rubber (EOR); (xii) the (A) EBC polyolefin compound is an ethylene/$(C_3\text{-}C_{20})$alpha-olefin) copolymer; (xiii) the (A) EBC polyolefin compound is an ethylene-propylene copolymer (EPP); (xiv) the (A) EBC polyolefin compound is an ethylene-propylene-diene monomer (EPDM) copolymer; and (xv) the (A) EBC polyolefin compound is a combination of any two or more of (i) to (xiv).

Aspect 3. The EBC formulation of aspect 1 or 2 wherein in the (B) alkenyl-functional monocyclic organosiloxane of formula (I) subscript n is 3 and wherein the EBC formulation is described by any one of limitations (i) to (x): (i) each $R^1$ is independently a $(C_2\text{-}C_3)$alkenyl; and each $R^2$ is independently H, $(C_1\text{-}C_2)$alkyl, or $(C_2\text{-}C_3)$alkenyl; (ii) each $R^1$ is vinyl; and each $R^2$ is independently $(C_1\text{-}C_2)$alkyl; (iii) each $R^1$ is vinyl; and each $R^2$ is methyl; (iv) each $R^1$ is allyl; and each $R^2$ is independently $(C_1\text{-}C_2)$alkyl; (v) each $R^1$ is allyl; and each $R^2$ is methyl; (vi) each $R^1$ is independently $H_2C=C(R^{1a})\text{---}C(=O)\text{---}O\text{---}(CH_2)_m\text{---}$ wherein $R^{1a}$ is H or methyl and subscript m is an integer from 1 to 4; and each $R^2$ is independently H, $(C_1\text{-}C_2)$alkyl, or $(C_2\text{-}C_3)$alkenyl; (vii) each $R^1$ is independently $H_2C=C(R^{1a})\text{---}C(=O)\text{---}O\text{---}(CH_2)_m\text{---}$ wherein $R^{1a}$ is H and subscript m is 3; and each $R^2$ is independently $(C_1\text{-}C_2)$alkyl; (viii) each $R^1$ is independently $H_2C=C(R^{1a})\text{---}C(=)\text{---}O\text{---}(CH_2)_m\text{---}$ wherein $R^{1a}$ is methyl and subscript m is 3; and each $R^2$ is independently $(C_1\text{-}C_2)$alkyl; (ix) the EBC formulation does not contain 24 wt % or more of, alternatively does not contain 22 wt % or more of, alternatively does not contain 20.0 wt % or more of, alternatively does not contain 15 wt % or more of, alternatively does not contain 10 wt % or more of, alternatively is free of an inorganic filler selected from the group consisting of aluminum oxide, aluminum silicate, calcium silicate, magnesium silicate, silica, titanium dioxide, and mixtures thereof; and (x) a combination of limitation (ix) and any one of limitations (i) to (viii).

Aspect 4. The EBC formulation of aspect 1 or 2 wherein in the (B) alkenyl-functional monocyclic organosiloxane of formula (I) subscript n is 4 and wherein the EBC formulation is described by any one of limitations (i) to (x): (i) each $R^1$ is independently a $(C_2\text{-}C_3)$alkenyl; and each $R^2$ is independently H, $(C_1\text{-}C_2)$alkyl, or $(C_2\text{-}C_3)$alkenyl; (ii) each $R^1$ is vinyl; and each $R^2$ is independently $(C_1\text{-}C_2)$alkyl; (iii) each $R^1$ is vinyl; and each $R^2$ is methyl; (iv) each $R^1$ is allyl; and each $R^2$ is independently $(C_1\text{-}C_2)$alkyl; (v) each $R^1$ is allyl; and each $R^2$ is methyl; (vi) each $R^1$ is independently $H_2C=C(R^{1a})\text{---}C(=O)\text{---}O\text{---}(CH_2)_m\text{---}$ wherein $R^{1a}$ is H or methyl and subscript m is an integer from 1 to 4; and each $R^2$ is independently H, $(C_1\text{-}C_2)$alkyl, or $(C_2\text{-}C_3)$alkenyl; (vii) each $R^1$ is independently $H_2C=C(R^{1a})\text{---}C(=O)\text{---}O\text{---}(CH_2)_m\text{---}$ wherein $R^{1a}$ is H and subscript m is 3; and each $R^2$ is independently $(C_1\text{-}C_2)$alkyl; (viii) each $R^1$ is independently $H_2C=C(R^{1a})\text{---}C(=)\text{---}O\text{---}(CH_2)_m\text{---}$ wherein $R^{1a}$ is methyl and subscript m is 3; and each $R^2$ is independently $(C_1\text{-}C_2)$alkyl; (ix) the EBC formulation does not contain 24 wt % or more (i.e., contains 0 to <24 wt %) of, alternatively does not contain 22 wt % or more of, alternatively does not contain 20.0 wt % or more of, alternatively does not contain 15 wt % or more of, alternatively does not contain 10 wt % or more of, alternatively is free of any inorganic filler; and (x) a combination of limitation (ix) and any one of limitations (i) to (viii).

Aspect 5. The EBC formulation of aspect 1 or 2 wherein in the (B) alkenyl-functional monocyclic organosiloxane of formula (I) subscript n is 5 or 6 and wherein the EBC formulation is described by any one of limitations (i) to (x): (i) each $R^1$ is independently a $(C_2\text{-}C_3)$alkenyl; and each $R^2$ is independently H, $(C_1\text{-}C_2)$alkyl, or $(C_2\text{-}C_3)$alkenyl; (ii) each $R^1$ is vinyl; and each $R^2$ is independently $(C_1\text{-}C_2)$alkyl; (iii) each $R^1$ is vinyl; and each $R^2$ is methyl; (iv) each $R^1$ is allyl; and each $R^2$ is independently $(C_1\text{-}C_2)$alkyl; (v) each $R^1$ is allyl; and each $R^2$ is methyl; (vi) each $R^1$ is independently $H_2C=C(R^{1a})\text{---}C(=O)\text{---}O\text{---}(CH_2)_m\text{---}$ wherein $R^{1a}$ is H or methyl and subscript m is an integer from 1 to 4; and each $R^2$ is independently H, $(C_1\text{-}C_2)$alkyl, or $(C_2\text{-}C_3)$alkenyl; (vii) each $R^1$ is independently $H_2C=C(R^{1a})\text{---}C(=O)\text{---}O\text{---}(CH_2)_m\text{---}$ wherein $R^{1a}$ is H and subscript m is 3; and each $R^2$ is independently $(C_1\text{-}C_2)$alkyl; (viii) each $R^1$ is independently $H_2C=C(R^{1a})\text{---}C(=O)\text{---}O\text{---}(CH_2)_m\text{---}$ wherein $R^{1a}$ is methyl and subscript m is 3; and each $R^2$ is independently ($C_1$-$C_2$)alkyl; (ix) the EBC formulation does not contain 24 wt % or more of, alternatively does not contain 22 wt % or more of, alternatively does not contain 20.0 wt % or more of, alternatively does not contain 15 wt % or more of, alternatively does not contain 10 wt % or more of, alternatively is free of an inorganic filler selected from the group consisting of aluminum oxide, aluminum silicate, calcium silicate, magnesium silicate, silica, titanium dioxide, and mixtures thereof; and (x) a combination of limitation (ix) and any one of limitations (i) to (viii).

Aspect 6. The EBC formulation of any one of aspects 1 to 5 also comprising at least one additive independently selected from optional constituents (additives) (C) to (O): (C) a carbon-based coagent; (D) a flame retardant; (E) an antioxidant; (F) a processing aid; (G) a colorant (e.g., carbon black); (H) a metal deactivator; (I) an (unsaturated carbon-carbon bond)-free hydrolyzable silane; (J) a corrosion inhibitor; (K) a hindered amine light stabilizer; (L) an ethylene-based copolymer that is different than constituent (A) and different than the semi-crystalline polyolefin having a crystallinity of 50 wt % or greater, wherein (L) is an ethylene/($C_4$-$C_{20}$)alpha-olefin copolymer, an ethylene/unsaturated carboxylic ester copolymer, or a propylene/ethylene-based copolymer; (M) a filler; (N) a nucleating agent; and (O) a treeing retardant such as a water treeing retardant or an electrical treeing retardant (i.e., voltage stabilizer). When the EBC formulation contains one or more optional additives, the total amount of the optional additive is from >0 to 70 wt %, alternatively from >0 to 60 wt %, alternatively from >0 to 40 wt %, alternatively from >0 to 20 wt % of the EBC formulation. The (M) filler does not include any omitted filler. In some aspects the polyolefin composition further comprises any two of (C) to (O). In some aspects the polyolefin composition further comprises the (E) antioxidant; alternatively the (E) antioxidant and the (H) hindered amine stabilizer.

Aspect 7. A method of making an (electron beam)-curable formulation of any one of aspects 1 to 6, the method comprising mixing together a divided solid form or melt form of the (A) EBC polyolefin compound; and (B) alkenyl-functional monocyclic organosiloxane of formula (I); and any optional constituents (C) to (O), alternatively (D) to (O), so as to give a mixture consisting essentially of constituents (A), (B), and any optional constituents (C) to (O), alternatively (D) to (O), so as to make the (electron beam)-curable (EBC) formulation; with the proviso that the method is free of each of a phosphazene base, a semi-crystalline polyolefin having a crystallinity of 50 wt % or greater, and an organic peroxide. The mixing may comprise melt mixing, soaking, or direct injection of (B) into (A). The melt mixing may comprise compounding, extruding, or kneading and may be carried out using a Farrel Continuous Mixer (FCM), tween extruder, buss kneader, or the like. Alternatively, the (B) alkenyl-functional monocyclic organosiloxane of formula (I) may be soaked by itself, or with one or more other soakable liquid additives, into the (A) EBC polyolefin compound (e.g., pellets) to give the EBC formulation. Alternatively, the (B) may be directly injected into (A) during profile extruding or molding of (A). The resulting EBC formulation may be irradiated with electron beam irradiation to give the cured polyolefin product. The extruded EBC formulation may be pelletized to give the EBC formulation as solid pellets. Alternatively, the extruded EBC formulation may be cooled to give the EBC formulation as a shaped solid such as an insulation layer on a cable.

Aspect 8. A method of electron-beam curing a formulation in need thereof, the method comprising irradiating the EBC formulation of any one of aspects 1 to 6, or the (electron beam)-curable formulation made by the method of aspect 7, with an effective dose of electron-beam irradiation so as to give an electron-beam cured polyolefin product. The EBC formulation in a shaped solid form may be cured by the method to give a shaped form of the electron-beam-cured polyolefin product. Alternatively, the EBC formulation may be cured when in a divided solid form such as powder, granules, pellets, or a combination of any two or more thereof.

Aspect 9. An electron-beam-cured polyolefin product made by the method of aspect 8. The product may have a defined shape such as a coating, film, or molded or extruded shape.

Aspect 10. A manufactured article comprising the electron-beam-cured polyolefin product of aspect 9 and a component in operative contact therewith. The component is made of a material other than the electron-beam-cured polyolefin product or EBC formulation. The component may be a substrate for supporting the EBC polyolefin product.

Aspect 11. A coated conductor comprising a conductive core and a polymeric layer at least partially surrounding the conductive core, wherein at least a portion of the polymeric layer comprises the electron-beam-cured polyolefin product of aspect 9. The coated conductor may be an insulated electrical conductor (power cable) and the polymeric layer may be an insulation layer thereof. Insulated electrical conductors typically comprise a conductive core covered by an insulation layer. The conductive core may be solid or stranded (e.g., a bundle of wires). Some insulated electrical conductors may also contain one or more additional elements such as semiconducting layer(s) and/or a protective jacket (e.g., wound wire, tape, or sheath). Examples are coated metal wires and electrical power cables, including those for use in low voltage ("LV", >0 to <5 kilovolts (kV)), medium voltage ("MV", 5 to <69 kV), high voltage ("HV", 69 to 230 kV) and extra-high voltage ("EHV", >230 kV) electricity-transmitting/distributing applications. Evaluations of power cables may use AEIC/ICEA standards and/or IEC test methods. In the field during operational use, the power cables are exposed to harmful effects of ultraviolet light (e.g., from the sun) and heat up to 90° C. or more (e.g., generated within the cable).

Aspect 12. A method of conducting electricity, the method comprising applying a voltage across the conductive core of the coated conductor of aspect 11 so as to generate a flow of electricity through the conductive core.

The inventive EBC formulation may be cured (crosslinked) via electron beam irradiation without ring opening of the (B) alkenyl-functional monocyclic organosiloxane. The curing reaction is conducted in such a way that the (B) alkenyl-functional monocyclic organosiloxane does not give a polymerized siloxane (silicone polymer) or silsesquioxane. We believe that the (B) alkenyl-functional monocyclic organosiloxane functions as a coagent (crosslinking agent) during electron beam curing of the EBC formulation and that the resulting cured polyolefin product has both direct polyolefin-polyolefin bonds and polyolefins crosslinked via a multivalent crosslinking group derived from the (B) alkenyl-functional monocyclic organosiloxane. Without being bound by theory it is believed that the constituents of the EBC formulation are chosen such that during electron beam curing of the EBC formulation the (B) alkenyl-functional monocyclic organosiloxane does not ring-open to give a ring-opened silanol (S—OH)-functional organosiloxane oligomer (linear or branched), and therefore a polymerized siloxane (silicone polymer) or silsesquioxane is not formed in situ. Without being bound by theory it is believed that the (B) alkenyl-functional monocyclic organosiloxane cannot undergo ring-opening at least in part because the EBC formulation does not contain, and thus because the curing reaction is conducted in the absence of, the (b) ring opening catalyst that is a phosphazene base. In the absence of the phosphazene base, the EBC formulation undergoes crosslinking of the (B) alkenyl-functional monocyclic organosiloxane to the polyolefin polymer via free-radical curing to form the cured polyolefin product. The crosslinking beneficially occurs without ring opening of the (B) alkenyl-functional monocyclic organosiloxane even in the presence of ambient moisture.

Additive: a solid or liquid compound or substance that imparts a desired property to a host polymer, or to a formulation comprising a masterbatch and host polymer, or to a reaction product prepared therefrom. The property may be a chemical, electrical, mechanical, optical, physical, and/or thermal property.

Alpha-olefin: a compound of formula (I): $H_2C=C(H)-R$ (I), wherein R is a straight chain alkyl group.

Crystallinity of a semi-crystalline polyolefin may be determined by differential scanning calorimetry (DSC) according to ASTM D3418-15 or the Crystallinity Test Method using DSC described later. For a semi-crystalline polyethylene resin, wt % crystallinity=$(\Delta H_f*100\%)/292$ J/g. For a semi-crystalline polypropylene resin, wt % crystallinity=$(\Delta H_f*100\%)/165$ J/g. In the respective equations $\Delta H_f$ is the second heating curve heat of fusion for the polyethylene resin or polypropylene resin, as the case may be, * indicates mathematical multiplication, / indicates mathematical division, 292 J/g is a literature value of the heat of fusion ($\Delta H_f$) for a 100% crystalline polyethylene, and 165 J/g is a literature value of the heat of fusion ($\Delta H_f$) for a 100% crystalline polypropylene. Preferably, crystallinity is determined by DSC according to the Crystallinity Test Method described later.

Cure agent: a radical-generating compound (in situ) that upon activation forms a free-radical and initiates or enhances reactions involving crosslinking of macromolecules. Activation of the cure agent may be achieved by subjecting the cure agent to heat or light. Examples of cure agents are peroxides, diazo-functional organic compounds, and 2,3-dimethyl-2,3-diphenylbutane. Examples of peroxides are hydrogen-organic peroxides of formula H—O—O—R and organic peroxides of formula R—O—O—R, wherein each R is independently a hydrocarbyl group. In some aspects the EBC formulation and the cured polyolefin product prepared therefrom are free of a cure agent, such as a peroxide such as a hydrogen-organic peroxide or an organic peroxide.

Curing: crosslinking to form a crosslinked product (network polymer).

Day: any consecutive 24 hour period.

Divided solid: a particulate material in a state of matter characterized by relatively stable shape and volume. Examples are powers, granules, and pellets.

Effective dose: an absorbed quantity (absorbed dose) sufficient to result in crosslinking of a polyolefin in need thereof and absorbing the quantity.

Electron-beam curable: capable of being cured by irradiation (treatment) with high-energy beta radiation such as from a high-energy electron-beam accelerator. The irradiation induces covalent bonding (crosslinking) between adjacent macromolecules to form a network polymer.

High density polyethylene (HDPE): having a density from 0.941 to 0.990 g/cm$^3$, an alpha-olefin comonomeric unit content greater than 0 wt %, and short chain branching.

Linear low density polyethylene (LLDPE): having density from 0.910 to 0.925 g/cm$^3$, an alpha-olefin comonomeric unit content greater than 0 wt %, and short chain branching. The LLDPE may have a comonomer distribution breadth index (CDBI) of from 70 to less than 100 weight percent.

Low density polyethylene (LDPE): a polyethylene homopolymer (0 wt % comonomeric unit content, CDBI=100%, free of short-chain branching) having density from 0.910 to 0.925 g/cm$^3$. LDPE may be made via free-radical polymerization mechanism in a catalyst-free, high pressure polymerization process.

Medium density polyethylene (MDPE): having a density from 0.926 to 0.940 g/cm$^3$.

Manufactured article: man-made (by hand or machine) thing.

Melt: a liquid formed by heating a solid material above its highest melting temperature.

Polyolefin: a macromolecule, or collection of macromolecules, composed of constitutional units derived from polymerizable olefins.

Semi-crystalline: a solid material having a first region that is crystalline and a second region that is amorphous. Having a percent crystallinity, typically between 5% and 90%, as measured by the Crystallinity Test Method described later.

Shaped solid: a state of matter of relatively constant volume and external form, which is man-made (by hand or machine). E.g., extruding, molding, or coating a fluid into the external form, followed by cooling the external form in place to give a shaped solid.

Storing: keeping or maintaining.

Sweat out: slow release of an additive from a solid material containing the additive therein.

Constituent (A) electron-beam curable (EBC) polyolefin compound ("Host Polymer"). The (A) EBC polyolefin compound may be a low density polyethylene (LDPE, linear low density polyethylene (LLDPE), a polyolefin elastomer, an ethylene/($C_3$-$C_{40}$)alpha-olefin) copolymer, or a combination (e.g., blend or melt mixture) of any two or more thereof. The LDPE may have a density from 0.910 to 0.925 g/cm$^3$. The LLDPE may have a density from 0.910 to 0.925 g/cm$^3$. The polyolefin elastomer based on ethylene copolymer may be selected from the EPR and EBR, alternatively the EPR and EOR, alternatively the EBR and EOR, alternatively EPR, alternatively EBR, alternatively EOR. Examples of such elastomers are ENGAGE™, AFFINITY™, and INFUSE™ polyolefin elastomers available from The Dow Chemical Company. The ethylene/($C_3$-$C_{20}$)alpha-olefin) copolymer may be an ethylene/propylene copolymer or an ethylene/($C_4$-$C_{20}$)alpha-olefin) copolymer as described herein. The ethylene-propylene copolymer (EPP) may be a bipolymer or an ethylene-propylene-diene monomer (EPDM) copolymer. The (A) EBC polyolefin compound may be different than the excluded semi-crystalline polyolefin and the (L) ethylene-based polymer additive in at least one characteristic selected from monomer composition, comonomer composition, density, crystallinity, melt index, melt flow rate, number-average molecular weight ($M_n$), weight-average molecular weight ($M_w$), molecular weight distribution ($M_w/M_n$), and porosity.

Prior to the mixing step used to prepare the EBC formulation, the (A) EBC polyolefin compound may be in a divided solid form such as a powder, granules and/or pellets.

Constituent (B) alkenyl-functional monocyclic organosiloxane (silicon-based coagent). A molecule that contains a backbone or ring substructure containing silicon and oxygen atoms and two or more propenyl, acrylate, and/or vinyl groups bonded thereto, or a collection of such molecules.

Constituent (B) is as defined earlier and is used in the EBC formulation in a crosslinking effective amount. The crosslinking effective amount of (B) may be from 0.01 to 50 wt %, alternatively from 0.1 to 25 wt %, alternatively from 0.5 to 10 wt %, alternatively from 0.9 to 5 wt %, alternatively from 1 to 4 wt %, based on the total weight of the EBC formulation. The crosslinking effective amount of (B) in the EBC formulation may vary depending upon the circumstances described above. For example, the crosslinking effective amount of (B) may be higher in embodiments of the polyolefin composition that contain (d) inorganic filler than in embodiments of the polyolefin composition that are free of (d) inorganic filler.

Regarding determining the crosslinking effective amount of the constituent (B), the presence of crosslinking may be detected as a percentage solvent extraction (Ext %). Ext %=W1/Wo*100%, wherein W1 is the weight after extraction, Wo is original weight before extraction, / indicates division, and * indicates multiplication. The absence of, or a reduced level of, the carbon-carbon double bond of the unsaturated organogroup (e.g., $R^1$) of (B) in the crosslinked polyolefin product (due to a coupling with the (A) EBC polyolefin compound may be detected by carbon-13 or silicon-29 nuclear magnetic resonance ($^{13}$C-NMR spectroscopy and/or $^{29}$Si-NMR) spectroscopy.

The optional constituent (C) carbon-based coagent. The (C) carbon-based coagent comprises a substructural group bonded to two or more olefinic crosslinking groups, wherein the substructural group is an acyclic or cyclic multivalent group that comprises a backbone or ring, respectively, containing in the backbone or ring carbon atoms and, optionally, nitrogen and/or oxygen atoms, but not silicon atoms. Examples are 2-allylphenyl allyl ether; 4-isopropenyl-2,6-dimethylphenyl allyl ether; 2,6-dimethyl-4-allylphenyl allyl ether; 2-methoxy-4-allylphenyl allyl ether; 2,2'-diallyl bisphenol A; O,O'-diallyl bisphenol A; or tetramethyl diallylbisphenol A; 2,4-diphenyl-4-methyl-1-pentene; 1,3-diisopropenylbenzene; triallyl isocyanurate; triallyl cyanurate; triallyl trimellitate; N,N,N',N',N'',N''-hexaallyl-1,3,5-triazine-2,4,6-triamine; triallyl orthoformate; pentaerythritol triallyl ether; triallyl citrate; triallyl aconitate; trimethylolpropane triacrylate; trimethylolpropane trimethylacrylate; ethoxylated bisphenol A dimethacrylate; 1,6-hexanediol diacrylate; pentaerythritol tetraacrylate; dipentaerythritol pentaacrylate; tris(2-hydroxyethyl) isocyanurate triacrylate; propoxylated glyceryl triacrylate; a polybutadiene having at least 50 wt % 1,2-vinyl content; trivinyl cyclohexane; and mixtures of any two or more thereof. In some aspects (C) is not present in the inventive masterbatch, formulation, and/or product. In some aspects (C) is present in the inventive masterbatch, formulation, and/or product at a concentration from 0.1 to 10 wt %, alternatively 1 to 5 wt %; and alternatively 2 to 5 wt %; all based on total weight thereof.

Optional constituent (additive) (D) flame retardant. The (D) flame retardant is a compound that inhibits or delays the spread of fire by suppressing chemical reactions in a flame. In some aspects (D) flame retardant is (D1) a mineral, (D2) an organohalogen compound, (D3) an (organo)phosphorus compound; (D4) a halogenated silicone; or (D5) a combination of any two or more of (D1) to (D4). In some aspects (D) is not present in the inventive masterbatch, formulation, and/or product. In some aspects (D) is present in the inventive masterbatch, formulation, and/or product at a concentration from 0.1 to 20 wt %, alternatively 1 to 10 wt %; and alternatively 5 to 20 wt %; all based on total weight thereof.

Optional constituent (additive) (E) antioxidant. A compound for inhibiting oxidation of a polyolefin. Examples of suitable second antioxidants are polymerized 1,2-dihydro-2,2,4-trimethylquinoline (Agerite MA); tris(4-tert-butyl-3-hydroxy-2,6-dimethylbenzyl)-s-triazine-2,4,6-(1H,3H,5H) trione (Cyanox 1790); distearyl-3,3-thiodiproprionate (DSTDP); tetrakismethylene (3,5-di-tert-butyl-4-hydroxyhydrocinnamate) methane (Irganox 1010); 1,2-bis(3,5-di-tert-butyl-4-hydroxyhydrocinnamoyl)hydrazine (Irganox 1024); bis(4,6-dimethylphenyl)isobutylidene (Lowinox 221B46); and 4,4-thiobis(2-tert-butyl-5-methylphenol) (TBM6). In some aspects (E) is not present in the inventive masterbatch, formulation, and/or product. In some aspects (E) is present in the inventive masterbatch, formulation, and/or product at a concentration of from 0.01 to 10 wt %, alternatively 0.05 to 5 wt %, alternatively 0.1 to 3 wt %, based on total weight thereof.

Optional constituent (additive) (F) processing aid. Constituent (F) may improve flow of a melt of the coagent masterbatch through a machine. (F) may be an organic processing aid such as a fluoropolymer or a silicone processing aid such as a polyorganosiloxane or fluoro-functionalized polyorganosiloxane. In some aspects (F) is not present in the inventive masterbatch, formulation, and/or product. In some aspects (F) is present in the inventive masterbatch, formulation, and/or product at a concentration of from 1 to 20 wt %, alternatively 2 to 18 wt %, alternatively 3 to 15 wt %, based on total weight thereof.

Optional constituent (additive) (G) a colorant. E.g., a pigment or dye. E.g., carbon black or titanium dioxide. The carbon black may be provided as a carbon black masterbatch that is a formulation of poly(1-butene-co-ethylene) copolymer (from ≥95 wt % to <100 wt % of the total weight of the masterbatch) and carbon black (from >0 wt % to ≤5 wt % of the total weight of the carbon black masterbatch. In some aspects (G) is not present in the inventive masterbatch, formulation, and/or product. In some aspects (G) colorant is present in the inventive masterbatch, formulation, and/or product at from 0.1 to 35 wt %, alternatively 1 to 10 wt %, based on total weight thereof.

Optional constituent (additive) (H) a metal deactivator. E.g., oxalyl bis(benzylidene hydrazide) (OABH). In some aspects (H) is not present in the inventive masterbatch, formulation, and/or product. In some aspects (H) is present in the inventive masterbatch, formulation, and/or product at from 0.001 to 0.2 wt %, alternatively 0.01 to 0.15 wt %, alternatively 0.01 to 0.10 wt %, all based on total weight thereof.

Optional constituent (additive) (I) (unsaturated carbon-carbon bond)-free hydrolyzable silane. Useful for scavenging moisture. Constituent (I) may be any monosilane containing at least 1, alternatively at least 2, alternatively at least 3, alternatively 4 hydrolyzable groups (e.g., $R^2$ as defined above); and at most 3, alternatively at most 2, alternatively at most 1, alternatively 0 non-hydrolyzable (unsaturated carbon-carbon bond)-free groups such as alkyl or aryl groups. Examples of (I) are acetoxytrimethylsilane, 4-benzylphenylsulfonoxytributylsilane, dimethylamino-methoxydioctylsilane, octyltrimethoxysilane, and tetramethoxysilane. In some aspects (I) is not present in the inventive masterbatch, formulation, and/or product. In some aspects (I) is present in the inventive masterbatch, formulation, and/or product at from 0.1 to 2 wt %, alternatively 0.1 to 1.5 wt %, alternatively 0.1 to 1.0 wt %; all based on total weight thereof.

Optional constituent (additive) (J) a corrosion inhibitor. E.g., tin (II) sulfate. In some aspects (J) is not present in the inventive masterbatch, formulation, and/or product. In some aspects (J) is present in the inventive masterbatch, formulation, and/or product at from 0.00001 to 0.1 wt %, alternatively 0.0001 to 0.01 wt %, based on total weight thereof.

Optional constituent (additive) (K) hindered amine light stabilizer. The (K) is a compound that inhibits oxidative degradation. Examples of suitable (K) are butanedioic acid dimethyl ester, polymer with 4-hydroxy-2,2,6,6-tetramethyl-1-piperidine-ethanol (CAS No. 65447-77-0, commercially LOWILITE 62); and poly[[6-[(1,1,3,3-tetramethylbutyl)amino]-1,3,5-triazine-2,4-diyl][(2,2,6,6-tetramethyl-4-piperidinyl)imino]-1,6 hexanediyl[(2,2,6,6-tetramethyl-4-piperidinyl)imino]]) (CAS 71878-19-8/70624-18-9, Chimassorb 994 LD, BASF). In some aspects (K) is not present in the inventive masterbatch, formulation, and/or product. In some aspects (K) is present in the inventive masterbatch, formulation, and/or product at from 0.001 to 0.4 wt %, alternatively 0.001 to 0.2 wt %, alternatively 0.01 to 0.15 wt %, alternatively 0.01 to 0.10 wt %, all based on total weight thereof.

Optional constituent (additive) (L) ethylene-based copolymer additive. The constituent (L) is different than constituents (A) and (C). (L) is an LDPE, an ethylene/alpha-olefin copolymer, an ethylene/unsaturated carboxylic ester copolymer (e.g., ethylene/vinyl acetate (EVA) copolymer, ethylene/ethyl acrylate (EEA) copolymer, or ethylene/ethyl methacrylate (EEMA) copolymer). In some aspects (L) is not present in the inventive masterbatch, formulation, and/or product. In some aspects (L) is present in the inventive masterbatch, formulation, and/or product at a concentration from 0.1 to 20 wt %, alternatively 1 to 10 wt %; and alternatively 5 to 20 wt %; all based on total weight thereof.

The optional constituent (M) filler: a finely-divided particulate solid or gel that occupies space in, and optionally affects function of, a host material. The (M) filler may be a calcined clay, an organoclays, or a hydrophobized fumed silica such as those commercially available under the CAB-O-SIL trade name from Cabot Corporation. The (M) filler may have flame retarding effects. In some aspects the inventive formulation and product is free of (M). When present, the (M) filler may be 1 to 40 wt %, alternatively 2 to 30 wt %, alternatively 5 to 20 wt % of the inventive formulation and product.

In regard to (M) filler, in some aspects the inventive formulation and product do not contain 20 wt % or more of, alternatively does not contain 15 wt % or more of, alternatively does not contain 10 wt % or more of, alternatively is free of an inorganic filler selected from the group consisting of aluminum oxide, aluminum silicate, calcium silicate, magnesium silicate, silica, titanium dioxide, and mixtures thereof. The inventive formulation and product may not contain 20 wt % or more of, alternatively does not contain 15 wt % or more of, alternatively does not contain 10 wt % or more of, alternatively is free of any inorganic filler selected from the group consisting of: solids containing Al, solids containing Ca, solids containing Mg, solids containing Si, solids containing Ti, and mixtures thereof. For avoidance of doubt, the term "inorganic filler" does not include carbon black.

The optional constituent (N) nucleating agent. An organic or inorganic additive that that enhances the rate of crystallization of a polyolefin polymer. Examples of (N) are calcium carbonate, titanium dioxide, barium sulfate, ultra-high-molecular-weight polyethylene, potassium hydrogen phthalate, benzoic acid compounds, sodium benzoate compounds, disodium bicyclo[2.2.1]heptane-2,3-dicarboxylate, zinc monoglycerolate, and 1,2-cyclohexanedicarboxylic acid, calcium salt:zinc stearate. In some aspects the inventive formulation and product is free of (N). When present, the (N) may be in a concentration of from 0.01 to 1.5 wt %, alternatively 0.05 to 1.2 wt %, alternatively 0.1 to 1.0 wt % of the inventive formulation and product.

The optional constituent (O) treeing retardant. The (O) treeing retardant is a molecule that inhibits water and/or electrical treeing, or a collection of such molecules. The treeing retardant may be a water treeing retardant or electrical treeing retardant. The water treeing retardant is a compound that inhibits water treeing, which is a process by which polyolefins degrade when exposed to the combined effects of an electric field and humidity or moisture. The electrical treeing retardant, also called a voltage stabilizer, is a compound that inhibits electrical treeing, which is an electrical pre-breakdown process in solid electrical insulation due to partial electrical discharges. Electrical treeing can occur in the absence of water. Water treeing and electrical treeing are problems for electrical cables that contain a coated conductor wherein the coating contains a polyolefin. The (O) treeing retardant may be a poly(ethylene glycol) (PEG).

Other optional constituents. In some aspects the inventive formulation and product does not contain any optional constituents. In some aspects the inventive formulation and product does not contain any optional constituents other than constituents (C) to (O). In some aspects the inventive formulation and/or product further contains at least one optional constituent (additive) that is a lubricant, mineral oil, or an anti-blocking agent. The inventive formulation and product may be free of a scorch retardant, which is not beneficial in curable formulations that are free of an organic peroxide, such as electron-beam curable formulations.

Any optional constituent may be useful for imparting at least one characteristic or property to the inventive masterbatch, formulation, and/or product in need thereof. The characteristic or property may be useful for improving performance of the inventive formulation and/or product in operations or applications wherein the inventive formulation and/or product is exposed to elevated operating temperature. Such operations or applications include melt mixing, extrusion, molding, hot water pipe, and insulation layer of an electrical power cable.

Electron-beam curable formulation. The total weight of all constituents and additives in the inventive formulation and product independently is 100.00 wt %. The electron-beam curable formulation may be a one-part formulation, alternatively a two-part formulation. The two-part formulation may comprise first and second parts, wherein the first part consists essentially of the constituents (A) and (B) and the second part consists essentially of one or more optional constituents (C) to (O).

The EBC formulation and cured polyolefin product made therefrom are free of the phosphazene base. The phosphazene base is a type of ring opening catalyst. The excluded phosphazene base has a core structure P=N, in which free N valencies are linked to hydrogen, hydrocarbyl, —P=N or =P—N, and free P valencies are linked to =N or —N. Examples of phosphazene bases are found in U.S. Pat. No. 8,426,519 B2, column 9, line 29, to column 10, line 31. The excluded phosphazene base includes combinations of two or more thereof.

In addition to the excluded phosphazene base, certain embodiments of the EBC formulation and cured polyolefin product made therefrom may also be free of other ring opening catalysts. Examples of other ring opening catalysts are found in F. O. Stark et al., Silicones, Comprehensive Organometallic Chemistry, volume 2, 305, Pergamon Press (1982). They include strong acids such as trifluoromethanesulfonic acid and its metal salts, sulfuric acid, perchloric acid, and hydrochloric acid; cationic ring opening catalysts such as metal halides; and anionic ring opening catalysts such as organolithiums, alkali metal oxides, and alkali metal hydroxides; and mixture of any two or more thereof. For example, the EBC formulation and cured polyolefin product made therefrom may be free of acid condensation catalysts that are (i) an organosulfonic acid, an organophosphonic acid, or a hydrogen halide; (ii) an organosulfonic acid; (iii) an alkyl-substituted arylsulfonic acid; (iv) an alkyl-substituted arylsulfonic acid wherein there is/are 1 or 2 ($C_5$-$C_{20}$) alkyl substituent(s) and 1 aryl group that is phenyl or naphthyl; (v) a ($C_1$-$C_5$)alkylphosphonic acid, wherein the ($C_1$-$C_5$)alkyl is unsubstituted or substituted with one —$NH_2$ group; (vi) HF, HCl, or HBr; (vii) a Lewis acid; or (viii) a combination of any two or more of (i) to (vii). The excluded other ring opening catalysts includes combinations of two or more thereof.

The EBC formulation and cured polyolefin product made therefrom are free of the semi-crystalline polyolefin having a crystallinity of 50 wt % or greater. The excluded semi-crystalline polyolefin may have a crystallinity of at least 55 wt %, alternatively at least 58 wt %, alternatively at least 59 wt %. In any one of the immediately preceding aspects the crystallinity may be at most 90 wt %, alternatively at most 80 wt %, alternatively at most 78 wt %. In some aspects the crystallinity is from 55 to 80 wt %, alternatively from 58 to 78 wt %, alternatively from 58 to 76 wt %, alternatively from 62 to 78 wt %, alternatively any one of 59±1 wt %, 62±1 wt %, 76±1 wt %, and 77±1 wt %. The excluded semi-crystalline polyolefin having a crystallinity of 50 wt % or greater includes combinations of two or more thereof.

The excluded semi-crystalline polyolefin may be a semi-crystalline polyethylene having a crystallinity of 50 wt % or greater. Examples are a semi-crystalline medium density polyethylene (MDPE), a semi-crystalline high density polyethylene (HDPE), or a combination thereof, all having a crystallinity of 50 wt % or greater. The excluded semi-crystalline HDPE may have a maximum density of 0.970 g/cm$^3$, alternatively at most 0.960 g/cm$^3$, alternatively at most 0.950 g/cm$^3$. The excluded semi-crystalline HDPE may have a density of from >0.935 to 0.970 g/cm$^3$, alternatively 0.935 to 0.965 g/cm$^3$. The density may be measured by ASTM D-1505, *Test Method for Density of Plastics by the Density-Gradient Technique*. The excluded semi-crystalline polyolefin may have a melt index ($I_2$, 190° C./2.16 kg load) of 10 to 20 g/10 min., alternatively 0.1 to 10 g/10 min., alternatively 0.20 to 9 g/10 min. The $I_2$ may be determined by ASTM D1238 as described later. The excluded semi-crystalline polyolefin may be characterized by a molecular weight distribution (MWD) that is monomodal, alternatively multimodal, e.g., bimodal. The excluded semi-crystalline polyolefin may be a semi-crystalline HDPE that is bimodal and has a density of from 0.950 to 0.958 g/cm$^3$ and a melt index of from 0.20 to 0.40 g/10 min. The excluded semi-crystalline polyolefin may be a semi-crystalline HDPE that is monomodal and has a density of from 0.930 to 0.970 g/cm$^3$ and a melt index of from 0.65 to 9 g/10 min., alternatively a density from 0.935 to 0.965 g/cm$^3$ and a melt index from 0.7 to 8.5 g/10 min.

The EBC formulation and cured polyolefin product made therefrom are free of the organic peroxide. The excluded organic peroxide is a molecule containing carbon atoms, hydrogen atoms, and two or more oxygen atoms, and having at least one —O—O— group, with the proviso that when there are more than one —O—O— group, each —O—O— group is bonded indirectly to another —O—O— group via one or more carbon atoms, or collection of such molecules. The excluded organic peroxide includes a monoperoxide of formula $R^O$—O—O—$R^O$, wherein each $R^O$ independently is a ($C_1$-$C_{20}$)alkyl group or ($C_6$-$C_{20}$)aryl group. Each ($C_1$-$C_{20}$)alkyl group of $R^O$ independently is unsubstituted or substituted with 1 or 2 ($C_6$-$C_{12}$)aryl groups. Each ($C_6$-$C_{20}$) aryl group of $R^O$ is independently unsubstituted or substituted with 1 to 4 ($C_1$-$C_{10}$)alkyl groups. The excluded organic peroxide also includes a diperoxide of formula $R^O$—O—O—R—O—O—$R^O$, wherein R is a divalent hydrocarbon group such as a ($C_2$-$C_{10}$)alkylene, ($C_3$-$C_{10}$)cycloalkylene, or phenylene, and each $R^O$ is as defined above. The excluded organic peroxide includes bis(1,1-dimethylethyl) peroxide; bis(1,1-dimethylpropyl) peroxide; 2,5-dimethyl-2,5-bis(1,1-dimethylethylperoxy) hexane; 2,5-dimethyl-2,5-bis(1,1-dimethylethylperoxy) hexyne; 4,4-bis(1,1-dimethylethylperoxy) valeric acid; butyl ester; 1,1-bis(1,1-dimethylethylperoxy)-3,3,5-trimethylcyclohexane; benzoyl peroxide; tert-butyl peroxybenzoate; di-tert-amyl peroxide ("DTAP"); bis(alpha-t-butyl-peroxyisopropyl) benzene ("BIPB"); isopropylcumyl t-butyl peroxide; t-butylcumylperoxide; di-t-butyl peroxide; 2,5-bis(t-butylperoxy)-2,5-dimethylhexane; 2,5-bis(t-butylperoxy)-2,5-dimethyl hexyne-3,1,1-bis(t-butylperoxy)-3,3,5-trimethylcyclohexane; isopropylcumyl cumylperoxide; butyl 4,4-di(tert-butylperoxy) valerate; or di(isopropylcumyl) peroxide; or dicumyl peroxide. The excluded organic peroxide includes combinations of two or more such organic peroxides.

Some embodiments of the EBC formulation and cured polyolefin product made therefrom may also be free of an inorganic filler that is chosen from aluminum oxide, aluminum silicate, calcium silicate, magnesium silicate, silica, titanium dioxide, and mixtures of any two or more thereof.

Some embodiments of the EBC formulation and cured polyolefin product made therefrom are free of each of the phosphazene base, the semi-crystalline polyolefin having a crystallinity of 50 wt % or greater, the organic peroxide, the ring opening catalysts other than the phosphazene base, and the inorganic filler. In some such embodiments the EBC formulation and cured polyolefin product made therefrom are also free of the (C) carbon-based coagent, $TiO_2$, or both (C) carbon-based coagent and $TiO_2$. The inventive formulation and product may be free of a silsesquioxane, alternatively any siloxane except constituent (B) and electron beam-curing (crosslinking) reaction products of (B).

($C_3$-$C_{20}$)alpha-olefin and ($C_3$-$C_{20}$)alpha-olefin. A compound of formula (I): $H_2C$=C(H)—R (I), wherein R is either a straight chain ($C_1$-$C_{18}$)alkyl group or a straight chain ($C_2$-$C_{18}$)alkyl group, respectively. The ($C_3$)alpha-olefin is 1-propene and its R group in formula (I) is methyl. The ($C_2$-$C_{18}$)alkyl group is a monovalent unsubstituted saturated hydrocarbon having from 2 to 18 carbon atoms. Examples of ($C_2$-$C_{18}$)alkyl are ethyl, propyl, butyl, pentyl, hexyl, heptyl, octyl, nonyl, decyl, undecyl, dodecyl, tridecyl, tetradecyl, pentadecyl, hexadecyl, heptadecyl, and octadecyl. In some embodiments the ($C_4$-$C_{20}$)alpha-olefin is 1-butene, 1-hexene, or 1-octene; alternatively 1-butene, 1-hexene, or 1-octene; alternatively 1-butene or 1-hexene; alternatively 1-butene or 1-octene; alternatively 1-hexene or 1-octene; alternatively 1-butene; alternatively 1-hexene; alternatively 1-octene; alternatively a combination of any two of 1-butene, 1-hexene, and 1-octene.

Any compound herein includes all its isotopic forms, including natural abundance forms and/or isotopically-enriched forms, which may have additional uses, such as medical or anti-counterfeiting applications.

Method of electron-beam irradiation curing. The method may comprise electron-beam irradiating the EBC formulation with an effective dose of electron-beam irradiation. The effective or absorbed dose of electron-beam irradiation may be from 49 to 201 kilojoules energy per kilogram of EBC formulation (kJ/kg), alternatively from 49 to 160 kJ/kg, alternatively from 80 to 201 kJ/kg, alternatively from 80 to 160 kJ/kg, alternatively from 50 to 80 kJ/kg, alternatively from 100 to 140 kJ/kg, alternatively from 160 to 201 kJ/kg. 100 kJ/kg equals 10 megarad (Mrad)/kg equals 100,000 Gray. 1 Gray=1 Joule per kilogram (J/kg)=100 rad. The electron-beam irradiation may be produced using an E-beam accelerator machine such as an Aibang AB5.0 machine available from Wuxi Aibang Radiation Technology Company, Limited, People's Republic of China. The electron-beam irradiating step may be conducted at any suitable temperature such as from 10° to 50° C. (e.g., 23° C.±1° C.), under any suitable atmosphere such as air or molecular nitrogen gas, and for any suitable length of time such as from 0.1 to 20 minutes, alternatively from 0.1 to 10 minutes, alternatively from 0.1 to 5 minutes. The irradiation may be dosed continuously or intermittently, alternatively continuously.

The following apply unless indicated otherwise. Alternatively precedes a distinct embodiment. ASTM means the standards organization, ASTM International, West Conshohocken, Pa., USA. IEC means the standards organization, International Electrotechnical Commission, Geneva, Switzerland. Any comparative example is used for illustration purposes only and shall not be prior art. Free of or lacks means a complete absence of; alternatively not detectable. IUPAC is International Union of Pure and Applied Chemistry (IUPAC Secretariat, Research Triangle Park, N.C., USA). May confers a permitted choice, not an imperative. Operative means functionally capable or effective. Optional(ly) means is absent (or excluded), alternatively is present (or included). PPM are weight based. Properties are measured using a standard test method and conditions for the measuring (e.g., viscosity: 23° C. and 101.3 kPa). Ranges include endpoints, subranges, and whole and/or fractional values subsumed therein, except a range of integers does not include fractional values. Room temperature is 23° C.±1° C. Substituted when referring to a compound means having, in place of hydrogen, one or more substituents, up to and including per substitution.

Crystallinity Test Method. For determining crystallinity in wt % of a semi-crystalline polyolefin resin such as (A) semi-crystalline polyolefin carrier resin. Determine melting peaks and weight percent (wt %) crystallinity using DSC instrument DSC Q1000 (TA Instruments) as follows. Procedure (A) Baseline calibrate instrument. Use software calibration wizard. First obtain a baseline by heating a cell from −80° to 280° C. without any sample in an aluminum DSC pan. Then use sapphire standards as instructed by the calibration wizard. The analyze 1 to 2 milligrams (mg) of a fresh indium sample by heating the standards sample to 180° C., cooling to 120° C. at a cooling rate of 10° C./minute, then keeping the standards sample isothermally at 120° C. for 1 minute, followed by heating the standards sample from 120° to 180° C. at a heating rate of 10° C./minute. Determine that indium standards sample has heat of fusion $(H_f)=28.71\pm0.50$ Joules per gram (J/g) and onset of melting=156.60°±0.5° C. Perform DSC measurements on test samples using same DSC instrument. For polyethylene test samples see procedure (B) below. For polypropylene test samples see procedure (C) below. Weight percent crystallinity values determined using DSC will be approximately 3 wt % lower than weight percent crystallinity values determined according to a method based on density.

Procedure (B) DSC on Polyethylene Test Samples. Press test sample of polymer into a thin film at a temperature of 160° C. Weigh 5 to 8 mg of test sample film in DSC pan. Crimp lid on pan to seal pan and ensure closed atmosphere. Place sealed pan in DSC cell, equilibrate cell at 30° C., and heat at a rate of about 100° C./minute to 140° C., keep sample at 140° C. for 1 minute, cool sample at a rate of 10° C./minute to 0° C. or lower (e.g., −40° C.) to obtain a cool curve heat of fusion $(H_f)$, and keep isothermally at 0° C. or lower (e.g., −40° C.) for 3 minutes. Then heat sample again at a rate of 10° C./minute to 180° C. to obtain a second heating curve heat of fusion $(\Delta H_f)$. Using the resulting curves, calculate the cool curve heat of fusion (J/g) by integrating from the beginning of crystallization to 10° C. Calculate the second heating curve heat of fusion (J/g) by integrating from 10° C. to the end of melting. Measure weight percent crystallinity (wt % crystallinity) of the polymer from the test sample's second heating curve heat of fusion $(\Delta H_f)$ and its normalization to the heat of fusion of 100% crystalline polyethylene, where wt % crystallinity= $(\Delta H_f*100\%)/292$ J/g, wherein $\Delta H_f$ is as defined above, * indicates mathematical multiplication, / indicates mathematical division, and 292 J/g is a literature value of heat of fusion $(\Delta H_f)$ for a 100% crystalline polyethylene.

Procedure (C) DSC on Polypropylene Test Samples. Press test sample of polypropylene into a thin film at a temperature of 210° C. Weigh 5 to 8 mg of test sample film in DSC pan. Crimp lid on pan to seal pan and ensure closed atmosphere. Place sealed pan in DSC cell and heat at a rate of about 100° C./minute to 230° C., keep sample at 230° C. for 5 minutes, cool sample at a rate of 10° C./minute to −20° C. to obtain a cool curve heat of fusion, and keep isothermally at −20° C. for 5 minutes. Then heat sample again at a rate of 10° C./minute until melting is complete to obtain a second heating curve heat of fusion $((\Delta H_f))$. Using the resulting curves, calculate the cool curve heat of fusion (J/g) by integrating from the beginning of crystallization to 10° C. Calculate the second heating curve heat of fusion (J/g) by integrating from 10° C. to the end of melting. Measure weight percent crystallinity (wt % crystallinity) of the polymer from the test sample's second heating curve heat of fusion $(\Delta H_f)$ and its normalization to the heat of fusion of 100% crystalline polypropylene, where wt % crystallinity= $(\Delta H_f*100\%)/165$ J/g, wherein $\Delta H_f$ is as defined above, * indicates mathematical multiplication, / indicates mathematical division, and 165 J/g is a literature value of heat of fusion $(\Delta H_f)$ for a 100% crystalline polypropylene.

Density Test Method: measured according to ASTM D792-13, *Standard Test Methods for Density and Specific Gravity (Relative Density) of Plastics by Displacement*, Method B (for testing solid plastics in liquids other than water, e.g., in liquid 2-propanol). Report results in units of grams per cubic centimeter (g/cm$^3$).

Gel Content Test Method: measured by ASTM D2765-01(2006), *Standard Test Methods for Determination of Gel Content and Swell Ratio of Crosslinked Ethylene Plastics*, Test Method A.

Hot Creep (Hot Set) Test Method: A test sample (dog-bone-shaped of specified dimensions in ASTM 638-34;

thickness <2 millimeter (mm); marker lines 20 mm apart) is placed in an oven at 200° C., and to the test sample is attached a weight equal to a force of 20 Newtons per square centimeter (N/cm$^2$). Elongation of the test sample (distance between marker lines) under these conditions is then measured, and expressed as a percentage of the initial 20 mm distance. To illustrate, if the distance between marker lines widens to 40 mm, the hot creep is 100% (100*(40-20)/20)=100%), if widens to 100 mm, the hot creep is 400%. All other things being equal, the lower the level of crosslinking in the test sample, the greater the extent of elongation thereof in the Hot Creep Test Method. Conversely, the higher the level of crosslinking in the test sample, the lesser the extent of elongation thereof. If the level of crosslinking in the test sample is low enough, the test sample can fail by breaking, which may occur within a few minutes or even seconds of start of its testing run. Although power cables may not experience operating temperatures as high as 200° C., this test is a reliable way for the industry to evaluate materials for use in insulation layers thereof. The lower the hot creep percent, the better the performance of the material. In the power cable industry, a hot creep of less than 175% after the test sample has been held for 15 minutes at 200° C. passes the hot creep test. And a hot creep of less than 100% after 15 minutes at 200° C. is especially desirable. If the test sample is intact after 15 minutes, the weight is removed, the test sample is removed from the oven and allowed to cool to room temperature. Residual elongation of the test sample after cooling is measured. For a power cable, the residual elongation at room temperature should be less than 15% of the hot creep value measured at 200° C.

Melt Flow Rate (230° C., 2.16 kilograms (kg), "MFR") Test Method: for propylene-based (co)polymer is measured according to ASTM D1238-13, using conditions of 230° C./2.16 kg, formerly known as "Condition E" and also known as MFR. Report results in units of grams eluted per 10 minutes (g/10 min.) or the equivalent in decigrams per 1.0 minute (dg/1 min.). 10.0 dg=1.00 g.

Melt Index (190° C., 2.16 kilograms (kg), "$I_2$") Test Method: for ethylene-based (co)polymer is measured according to ASTM D1238-13, using conditions of 190° C./2.16 kg, formerly known as "Condition E" and also known as $I_2$. Report results in units of grams eluted per 10 minutes (g/10 min.) or the equivalent in decigrams per 1.0 minute (dg/1 min.). 10.0 dg=1.00 g.

Sweat Out Test Method (Qualitative): Add polyethylene pellets sample with coagent to a separate, unused press-sealed polyethylene plastic bag (also known as zip lock or click seal bags). Seal bags. Press pellets in bags. Store bags and contents at room temperature for 14 days. At 14 days observe bags for oil traces left over on the bags' surfaces under light. Oil trace indicates surface migration and poor solubility. More oil trace on surface of bag, more sweat-out of coagent. Rank progressive amount of sweat out by characterizing the oil trace as none, very little, little, or obvious (more than a little).

EXAMPLES

EBC polyolefin compound (A1): a low density polyethylene (LDPE) product number DXM-446, which has crystallinity of 45 wt %, a density of 0.92 g/cm$^3$ and a melt index ($I_2$) of 2 g/10 min. and is obtained from The Dow Chemical Company.

EBC polyolefin compound (A2): an ethylene-propylene-diene monomer (EPDM) copolymer product number NORDEL 4725 having a crystallinity of 12 wt %, a density of 0.88 g/cm$^3$ and a 25 Mooney viscosity ML 1+4 at 125° C. determined by ASTM D1646; and is obtained from The Dow Chemical Company.

EBC polyolefin compound (A3): an ethylene-octene (POE) copolymer product number ENGAGE 8150 having a crystallinity of 16 wt %, a density of 0.868 g/cm$^3$ and a melt index ($I_2$) of 0.5 g/10 min. and is obtained from The Dow Chemical Company.

Alkylene-functional monocyclic organosiloxane (B1): tetramethyl-tetravinyl-cyclotetrasiloxane (ViD4) is obtained from The Dow Chemical Company.

Compounds (A1) to (A3) were free of antioxidant and stabilizer.

Carbon-based coagent ($C_1$): trimethylolpropane trimethylacrylate (TMPTMA).

Carbon-based coagent ($C_2$): triallyl isocyanurate (TAIC).

Comparative Examples 1 to 9 (CE1 to CE9): comparative EBC formulations CE1 to CE9: Melt mix LDPE (A1), EPDM (A2), or POE (A3), as the case may be as described later in the Tables; and either none or a carbon-based coagent ($C_1$) or ($C_2$) in a Banbury compounder using a compounding temperature of 155° C., rotor speed of 60 to 65 rotations per minute (rpm), followed by extruding the melt of coagent masterbatch with air cooling to give extruded coagent masterbatch, and pelletizing the extruded coagent masterbatch to give comparative EBC formulations of CE1 to CE9, respectively, as pellets. See Table 1 for composition data.

Comparative Examples A and I (CE(A) to CE(I)): comparative cured polyolefin products prepared by separately hot pressing a different one of the comparative formulations CE1 to CE9 at 120° C. to shape the formulations as a 1-mm thick sheets, and then curing the sheets with 100 kilojoules per kilogram (kJ/kg) irradiation dose of electron-beam to give comparative cured products of CE(A) to CE(I), respectively. See Table 1 for properties data.

Inventive Examples 1 to 5 (IE1 to IE5): inventive EBC formulations 1 to 4. Melt mix LDPE (A1), EPDM (A2), or POE (A3), as the case may be as described later in the Tables; and silicon-based coagent (B1) in a Banbury compounder using a compounding temperature of 155° C., rotor speed of 60 to 65 rotations per minute (rpm), followed by extruding the melt of EBC formulations with air cooling to give extruded EBC formulations, and pelletizing the extruded EBC formulations to give EBC formulations of IE1 to IE5, respectively as pellets. See Table 2 for composition data.

Inventive Examples A to E: inventive cured polyolefin products IE(A) to IE(E). prepared by curing the EBC formulations of IE1 to IE5, respectively, with 100 kilojoules per kilogram (kJ/kg) irradiation dose of electron-beam to give the cured polyolefin products IE(A) to IE(E), respectively. See Table 2 for properties data.

TABLE 1

Compositions (wt %) and properties: CE1 to CE9/CE(A) to CE(I).

| | Ex. No. | | | | | | | | |
|---|---|---|---|---|---|---|---|---|---|
| | CE 1/(A) | CE 2/(B) | CE 3/(C) | CE 4/(D) | CE 5/(E) | CE 6/(F) | CE 7/G) | CE 8/(H) | CE 9/(I) |
| LDPE (A1) | 100 | 99 | 99 | 0 | 0 | 0 | 0 | 0 | 0 |
| EPDM (A2) | 0 | 0 | 0 | 100 | 99 | 99 | 0 | 0 | 0 |
| POE (A3) | 0 | 0 | 0 | 0 | 0 | 0 | 100 | 99 | 99 |
| TAIC (C1) | 0 | 1 | 0 | 0 | 1 | 0 | 0 | 1 | 0 |
| TMPTMA (C2) | 0 | 0 | 1 | 0 | 0 | 1 | 0 | 0 | 1 |
| Total | 100 | 100 | 100 | 100 | 100 | 100 | 100 | 100 | 100 |
| Hot Creep (%), 10 Mrad | Fail* | Fail* | Fail* | Fail* | 137 | 82 | 80 | 105 | 95 |
| Migration (Qualitative) | N/a** | Yes^ | Yes | N/a | Yes | Yes | N/a | Little | Little |
| Gel Content (%) | 55 | 57 | 58 | 58.5 | 60.5 | 68 | 74.7 | 72 | 74 |

*Fail: CE1/(A) broke at 3 minutes, CE2/(B) broke at 5 minutes, CE3/(C) broke at 8 minutes, CE4/(D) broke at 14 minutes.
**N/a means not applicable.
^Yes means obvious.

TABLE 2

Compositions (wt %) and properties: IE1 to IE5/IE(A) to IE(E).

| Ex. No. | IE1/IE(A) | IE2/IE(B) | IE3/IE(C) | IE4/IE(D) | IE5/IE(E) |
|---|---|---|---|---|---|
| LDPE (A1) | 99 | 0 | 0 | 98 | 96 |
| EPDM (A2) | 0 | 99 | 0 | 0 | 0 |
| POE (A3) | 0 | 0 | 99 | 0 | 0 |
| ViD4 (B1) | 1 | 1 | 1 | 2 | 4 |
| Total | 100 | 100 | 100 | 100 | 100 |
| Hot Creep (%), 10 Mrad | 267 | 113 | 62 | 170 | 115 |
| Migration (Qualitative) | None | None | None | None | None |
| Gel Content (%) | 61 | 62.5 | 74.8 | N/m* | N/m |

*N/m means not measured.

The hot creep data in Tables 1 and 2 show that the inventive EBC formulations are significantly better at curing to give inventive cured polyolefin products having improved (decreased) hot creep at 200° C. than are comparative cured polyolefin products prepared from comparative EBC formulations. The inventive EBC formulations also have less sweat out of ViD4 (B1) than the comparative EBC formulations have sweat out of TAIC (C1) or TMPTMA (C2), which benefit enables higher loading of (B) in the (A) EBC polyolefin compound, such as an LDPE, EPDM, or POE, in the inventive EBC formulations than loading of (C) carbon-based coagent in the same LDPE, EPDM, or POE of the comparative EBC formulations. Higher loading of (B) in the inventive EBC formulations can improve (increase) efficiency of electron beam-curing thereof, enabling lower doses of absorbed electron beam irradiation to be used to achieve a given cure state or enabling same dose of absorbed electron beam irradiation to give a greater cure state (greater amount of crosslinking).

The invention claimed is:

1. An (electron beam)-curable (EBC) formulation comprising constituents (A) and (B):
   (A) an (electron beam)-curable (EBC) polyolefin compound having a crystallinity of from 0 to less than 50 weight percent (wt %) as measured by Crystallinity Test Method using differential scanning calorimetry (DSC) or having a density of 0.930 gram per cubic centimeter (g/cm$^3$) or less as measured by ASTM D792-13, Method B or having both the crystallinity of from 0 to less than 50 wt % and the density of 0.930 g/cm$^3$ or less; and
   (B) an alkenyl-functional monocyclic organosiloxane of formula (I): $[R^1,R^2SiO_{2/2}]_n$ (I), wherein subscript n is an integer greater than or equal to 3; each $R^1$ is independently a ($C_2$-$C_4$)alkenyl or a $H_2C=C(R^{1a})$—$C(=O)$—$O$—$(CH_2)_m$— wherein $R^{1a}$ is H or methyl and subscript m is an integer from 1 to 4; and each $R^2$ is independently H, ($C_1$-$C_4$)alkyl, phenyl, or $R^1$;
   wherein (A) is 50.0 to 99.99 wt % and (B) is from 50.0 to 0.01 wt % of the combined weight of constituents (A) and (B); and
   with the proviso that the EBC formulation is free of each of a phosphazene base, a semi-crystalline polyolefin having a crystallinity of 50 wt % or greater, and an organic peroxide; and
   wherein in the (B) alkenyl-functional monocyclic organosiloxane of formula (I) subscript n is 3 and wherein the EBC formulation is described by any one of limitations (i) to (x): (i) each $R^1$ is independently a ($C_2$-$C_3$)alkenyl; and each $R^2$ is independently H, ($C_1$-$C_2$)alkyl, or ($C_2$-$C_3$)alkenyl; (ii) each $R^1$ is vinyl; and each $R^2$ is independently ($C_1$-$C_2$)alkyl; (iii) each $R^1$ is vinyl; and each $R^2$ is methyl; (iv) each $R^1$ is allyl; and each $R^2$ is independently ($C_1$-$C_2$)alkyl; (v) each $R^1$ is allyl; and each $R^2$ is methyl; (vi) each $R^1$ is independently $H_2C=C(R^{1a})$—$C(=O)$—$O$—$(CH_2)_m$— wherein $R^{1a}$ is H or methyl and subscript m is an integer from 1 to 4; and each $R^2$ is independently H, ($C_1$-$C_2$)alkyl, or ($C_2$-$C_3$)alkenyl; (vii) each $R^1$ is independently $H_2C=C(R^{1a})$—$C(=O)$—$O$—$(CH_2)_m$— wherein $R^{1a}$ is H and subscript m is 3; and each $R^2$ is independently ($C_1$-$C_2$)alkyl; (viii) each $R^1$ is independently $H_2C=C(R^{1a})$—$C(=O)$—$O$—$(CH_2)_m$— wherein $R^{1a}$ is methyl and subscript m is 3; and each $R^2$ is independently ($C_1$-$C_2$)alkyl; (ix) the EBC formulation does not contain 24 wt % or more of an inorganic filler selected from the group consisting of aluminum oxide, aluminum silicate, calcium silicate, magnesium silicate, silica, titanium dioxide, and mixtures thereof; and (x) a combination of limitation (ix) and any one of limitations (i) to (viii); or wherein in the (B) alkenyl-functional monocyclic organosiloxane of formula (I) subscript n is 5 or 6 and wherein the EBC formulation is described by any one of limitations (i) to (x): (i) each $R^1$ is independently a $(C_2-C_3)$alkenyl; and each $R^2$ is independently H, $(C_1-C_2)$alkyl, or $(C_2-C_3)$alkenyl; (ii) each $R^1$ is vinyl; and each $R^2$ is independently $(C_1-C_2)$alkyl; (iii) each $R^1$ is vinyl; and each $R^2$ is methyl; (iv) each $R^1$ is allyl; and each $R^2$ is independently $(C_1-C_2)$alkyl; (v) each $R^1$ is allyl; and each $R^2$ is methyl; (vi) each $R^1$ is independently $H_2C=C(R^{1a})-C(=O)-O-(CH_2)_m-$ wherein $R^{1a}$ is H or methyl and subscript m is an integer from 1 to 4; and each $R^2$ is independently H, $(C_1-C_2)$alkyl, or $(C_2-C_3)$alkenyl; (vii) each $R^1$ is independently $H_2C=C(R^{1a})-C(=O)-O-(CH_2)_m-$ wherein $R^{1a}$ is H and subscript m is 3; and each $R^2$ is independently $(C_1-C_2)$alkyl; (viii) each $R^1$ is independently $H_2C=C(R^{1a})-C(=O)-O-(CH_2)_m-$ wherein $R^{1a}$ is methyl and subscript m is 3; and each $R^2$ is independently $(C_1-C_2)$alkyl; (ix) the EBC formulation does not contain 24 wt % or more of an inorganic filler selected from the group consisting of aluminum oxide, aluminum silicate, calcium silicate, magnesium silicate, silica, titanium dioxide, and mixtures thereof; and (x) a combination of limitation (ix) and any one of limitations (i) to (viii).

2. The (electron beam)-curable formulation of claim 1 wherein the (A) EBC polyolefin compound is characterized by any one of limitations (i) to (xv): (i) a crystallinity of from >0 to less than 50.0 wt % as measured by Crystallinity Test Method using differential scanning calorimetry (DSC); (ii) a density of 0.930 g/cm³ or less as measured by ASTM D792-13, Method B; (iii) both (i) and (ii); (iv) a melt index ($I_2$, 190° C./2.16 kg load) of 0.1 to 20 grams per 10 minutes (g/10 min.) measured according to the Melt Index Test Method and is a polyethylene; (v) a melt flow rate (MFR) of 0.5 to 20 g/10 min. (230° C./2.16 kg load) measured according to the Melt Flow Rate Test Method and is a polypropylene; (vi) a molecular weight distribution (MWD) that is monomodal; (vii) a MWD that is multimodal; (viii) wherein the combined weight of constituents (A) and (B) is from 50 to 100 wt % of the (electron beam)-curable formulation; (ix) the (A) EBC polyolefin compound is a low density polyethylene (LDPE) having a density from 0.910 to 0.925 g/cm³; (x) the (A) EBC polyolefin compound is a linear low density polyethylene (LLDPE) having a density from 0.910 to 0.925 g/cm³; (xi) the (A) EBC polyolefin compound is a polyethylene elastomer selected from ethylene-propylene rubber (EPR), an ethylene-1-butene rubber (EBR), and an ethylene-1-octene rubber (EOR); (xii) the (A) EBC polyolefin compound is an ethylene/$(C_3-C_{20})$alpha-olefin) copolymer; (xiii) the (A) EBC polyolefin compound is an ethylene-propylene copolymer (EPP); (xiv) the (A) EBC polyolefin compound is an ethylene-propylene-diene monomer (EPDM) copolymer; and (xv) the (A) EBC polyolefin compound is a combination of any two or more of (i) to (xiv).

3. The (electron beam)-curable formulation of claim 1 wherein in the (B) alkenyl-functional monocyclic organosiloxane of formula (I) subscript n is 3 and wherein the EBC formulation is described by any one of limitations (i) to (x): (i) each $R^1$ is independently a $(C_2-C_3)$alkenyl; and each $R^2$ is independently H, $(C_1-C_2)$alkyl, or $(C_2-C_3)$alkenyl; (ii) each $R^1$ is vinyl; and each $R^2$ is independently $(C_1-C_2)$alkyl; (iii) each $R^1$ is vinyl; and each $R^2$ is methyl; (iv) each $R^1$ is allyl; and each $R^2$ is independently $(C_1-C_2)$alkyl; (v) each $R^1$ is allyl; and each $R^2$ is methyl; (vi) each $R^1$ is independently $H_2C=C(R^{1a})-C(=O)-O-(CH_2)_m-$ wherein $R^{1a}$ is H or methyl and subscript m is an integer from 1 to 4; and each $R^2$ is independently H, $(C_1-C_2)$alkyl, or $(C_2-C_3)$alkenyl; (vii) each $R^1$ is independently $H_2C=C(R^{1a})-C(=O)-O-(CH_2)_m-$ wherein $R^{1a}$ is H and subscript m is 3; and each $R^2$ is independently $(C_1-C_2)$alkyl; (viii) each $R^1$ is independently $H_2C=C(R^{1a})-C(=O)-O-(CH_2)_m-$ wherein $R^{1a}$ is methyl and subscript m is 3; and each $R^2$ is independently $(C_1-C_2)$alkyl; (ix) the EBC formulation does not contain 24 wt % or more of an inorganic filler selected from the group consisting of aluminum oxide, aluminum silicate, calcium silicate, magnesium silicate, silica, titanium dioxide, and mixtures thereof; and (x) a combination of limitation (ix) and any one of limitations (i) to (viii).

4. The (electron beam)-curable formulation of claim 1 wherein in the (B) alkenyl-functional monocyclic organosiloxane of formula (I) subscript n is 5 or 6 and wherein the EBC formulation is described by any one of limitations (i) to (x): (i) each $R^1$ is independently a $(C_2-C_3)$alkenyl; and each $R^2$ is independently H, $(C_1-C_2)$alkyl, or $(C_2-C_3)$alkenyl; (ii) each $R^1$ is vinyl; and each $R^2$ is independently $(C_1-C_2)$alkyl; (iii) each $R^1$ is vinyl; and each $R^2$ is methyl; (iv) each $R^1$ is allyl; and each $R^2$ is independently $(C_1-C_2)$alkyl; (v) each $R^1$ is allyl; and each $R^2$ is methyl; (vi) each $R^1$ is independently $H_2C=C(R^{1a})-C(=O)-O-(CH_2)_m-$ wherein $R^{1a}$ is H or methyl and subscript m is an integer from 1 to 4; and each $R^2$ is independently H, $(C_1-C_2)$alkyl, or $(C_2-C_3)$alkenyl; (vii) each $R^1$ is independently $H_2C=C(R^{1a})-C(=O)-O-(CH_2)_m-$ wherein $R^{1a}$ is H and subscript m is 3; and each $R^2$ is independently $(C_1-C_2)$alkyl; (viii) each $R^1$ is independently $H_2C=C(R^{1a})-C(=O)-O-(CH_2)_m-$ wherein $R^{1a}$ is methyl and subscript m is 3; and each $R^2$ is independently $(C_1-C_2)$alkyl; (ix) the EBC formulation does not contain 24 wt % or more of an inorganic filler selected from the group consisting of aluminum oxide, aluminum silicate, calcium silicate, magnesium silicate, silica, titanium dioxide, and mixtures thereof; and (x) a combination of limitation (ix) and any one of limitations (i) to (viii).

5. The (electron beam)-curable formulation of claim 1 also comprising at least one additive independently selected from constituents (C) to (O): (C) a carbon-based coagent; (D) a flame retardant; (E) an antioxidant; (F) a processing aid; (G) a colorant; (H) a metal deactivator; (I) an (unsaturated carbon-carbon bond)-free hydrolyzable silane; (J) a corrosion inhibitor; (K) a hindered amine light stabilizer; (L) an ethylene-based copolymer that is different than constituent (A) and different than the semi-crystalline polyolefin having a crystallinity of 50 wt % or greater, wherein (L) is an ethylene/$(C_4-C_{20})$alpha-olefin copolymer, an ethylene/unsaturated carboxylic ester copolymer, or a propylene/ethylene-based copolymer; (M) a filler; (N) a nucleating agent; and (O) a treeing retardant.

6. A method of making an (electron beam)-curable formulation of claim 1, the method comprising mixing together a divided solid form or melt form of the (A) EBC polyolefin compound; and (B) alkenyl-functional monocyclic organosiloxane of formula (I); and any optional constituents (C) to (O), so as to give a mixture consisting essentially of constituents (A), (B), and any optional constituents (C) to (O), so as to make the (electron beam)-curable (EBC) formulation; with the proviso that the method is free of each of a phosphazene base, a semi-crystalline polyolefin having a crystallinity of 50 wt % or greater, and an organic peroxide.

7. A method of electron-beam curing a formulation in need thereof, the method comprising irradiating the EBC formulation of claim 1, with an effective dose of electron-beam irradiation so as to give an electron-beam cured polyolefin product.

8. An electron-beam-cured polyolefin product made by the method of claim 7.

9. A manufactured article comprising the electron-beam-cured polyolefin product of claim 8 and a component in operative contact therewith.

10. A coated conductor comprising a conductive core and a polymeric layer at least partially surrounding the conductive core, wherein at least a portion of the polymeric layer comprises the electron-beam-cured polyolefin product of claim 8.

11. A method of conducting electricity, the method comprising applying a voltage across the conductive core of the coated conductor of claim 10 so as to generate a flow of electricity through the conductive core.

\* \* \* \* \*